US008536885B2

(12) United States Patent
Raval et al.

(10) Patent No.: US 8,536,885 B2
(45) Date of Patent: Sep. 17, 2013

(54) METHOD AND DEVICE FOR DETERMINING IONIZING RADIATION

(75) Inventors: Harshil Narendra Raval, Mumbai (IN);
Shree Prakash Tiwari, Mumbai (IN);
Ramesh Raju Navan, Mumbai (IN);
Ramgopal Valipe Rao, Mumbai (IN);
Anil Kumar, Mumbai (IN)

(73) Assignee: Indian Institute of Technology, Bombay, Mumbai (IN)

( * ) Notice: Subject to any disclaimer, the term of this patent is extended or adjusted under 35 U.S.C. 154(b) by 397 days.

(21) Appl. No.: 12/997,531

(22) PCT Filed: Sep. 9, 2009

(86) PCT No.: PCT/IN2009/000492
§ 371 (c)(1),
(2), (4) Date: Dec. 10, 2010

(87) PCT Pub. No.: WO2010/046904
PCT Pub. Date: Apr. 29, 2010

(65) Prior Publication Data
US 2011/0089959 A1    Apr. 21, 2011

(30) Foreign Application Priority Data

Sep. 11, 2008    (IN) .......................... 1927/MUM/2008

(51) Int. Cl.
*G01R 27/08*    (2006.01)
*G01R 31/02*    (2006.01)
*G01T 3/08*    (2006.01)

(52) U.S. Cl.
USPC .................. 324/702; 324/762.01; 250/370.05

(58) Field of Classification Search
USPC .................... 324/702, 691, 649, 600, 762.09, 324/762.01, 537, 500; 250/337, 336.1, 390.01, 250/328
See application file for complete search history.

(56) References Cited

U.S. PATENT DOCUMENTS

| 3,484,605 A | 12/1969 | Attix et al. |
| 4,572,900 A | 2/1986 | Wohltjen |

(Continued)

FOREIGN PATENT DOCUMENTS

| EP | 0158588 | 10/1985 |
| EP | 1584748 | 10/2005 |

OTHER PUBLICATIONS

Adam, et al., "The Development of an MOS Dosimeter Unit for Use in Space", *IEEE Transactions on Nuclear Science*, vol. 5, No. 6, p. 1607-1612, Dec. 1978.

(Continued)

*Primary Examiner* — Hoai-An D Nguyen

(74) *Attorney, Agent, or Firm* — Klein, O'Neill & Singh, LLP

(57) ABSTRACT

A method for determining ionizing radiation including applying a constant voltage across an organic semiconducting material sensor prior to and after exposure of the sensor to the ionizing radiation; measuring and converting the current passing through the sensor proportional to the conductivity or resistivity of the sensor which in turn is proportional to the ionizing radiation in the sensor, into a proportional analog voltage value; and comparing the value obtained prior to and after exposure of the sensor to the ionizing radiation and computing the ionizing radiation based on the change in the value. An electronic device for determining ionizing radiation including an organic semiconductor resistor, a constant voltage source, and to a current to voltage converter, an analog to digital converter, and a microprocessor.

4 Claims, 10 Drawing Sheets

(56) References Cited

U.S. PATENT DOCUMENTS

| | | | |
|---|---|---|---|
| 4,634,869 A | 1/1987 | Korobchenko et al. | |
| 4,687,935 A | 8/1987 | Nurmi et al. | |
| 6,476,597 B1 * | 11/2002 | Spratt et al. | 324/750.07 |
| 7,141,839 B2 | 11/2006 | Thomas et al. | |
| 7,186,987 B1 | 3/2007 | Doty et al. | |

OTHER PUBLICATIONS

Bhat, et al., "Interface-State Generation Under Radiation and High-Field Stressing in Reoxidized Nitrided Oxide MOS Capacitors", *IEEE Transactions on Nuclear Science*, vol. 39, No. 6, Dec. 1992.

Asensio, et al., "Evaluation of a Low-Cost Commercial Mosfet as Radiation Dosimeter", *Sensors and Actuators*, A 125, p. 288-295, 2006.

Garlick, et al., "The Physics of the Scintillation Counter", *journal of Scientific Instruments*, vol. 35, Oct. 1955.

Hinrichsen, et al., "A Stabilized Scintillation Counter", *IEEE Transactions on Nuclear Science*, Jun. 1964.

Fontbonne, et al., "Scintillating Fiber Dosimeter for Radiation Therapy Accelerator", *IEEE Transactions on Nuclear Science*, vol. 49, No. 5, 2002.

Shaw, et al., "Organic Electronics: Introduction", *IBM J. Res. & Dev.*, vol. 45, No. 1, p. 3-9, Jan. 2001.

Dimitrakopoulos, et al., "Organic Thin-Film Transistors: A Review of Recent Advances", *IBM J. Res. & Dev.*, vol. 45, No. 1, p. 11-29, Jan. 2001.

Kelley, et al., "High-Performance OTFTs Using Surface-Modified Alumina Dielectrics", *J. Phys. Chem. B*, vol. 107, p. 5877-5881, Mar. 24, 2003.

Dimitrakopoulos, et al., "Organic Thin Film Transistors for Large Area Electronics", *Advanced Materials*, vol. 14, No. 2, p. 99-117, Jan. 16, 2002.

Klauk, et al., "Flexible Organic Complementary Circuits", *IEEE Transactions on Electron Devices*, vol. 52, No. 4, p. 618-622, Apr. 2005.

Natali, et al., "Detectors Based on Organic Materials: Status and Perspectives", *Nuclear Instruments & Methods in Physics Research*, Section A, vol. 512, p. 419-426, Oct. 11, 2003.

International Search Report from the Australian Patent Office dated Aug. 16, 2010 for International Application No. PCT/IN2009/000492.

* cited by examiner

METHOD AND DEVICE FOR DETERMINING IONIZING RADIATION

FIELD OF THE INVENTION

This invention relates to a method and device for determining ionizing radiation.

BACKGROUND OF THE INVENTION

Operational performance of electronic devices are reported to degrade with their exposure to ionizing radiation (Andrew Holmes-Siedle and Leonard Adams. "The Development of an MOS Dosimeter for use in Space". IEEE Trans. Nucl. Sci., 25 (6), pp. 1607-1612, 1978; N. Bhat and J. Vasi, "Interface-state generation under radiation and high-field stressing in RNO MOS capacitors," IEEE Trans. Nucl. Sci., 39, 2230, 1992.). Radiation effects are a matter of grave concern for space environment, nuclear applications and electronic gadgets operating in radiation prone environment. These radiation effects can be used in the positive sense as application of these devices in radiation dosimetry. (L. J. Asensio et. al., "Evaluation of a low-cost commercial mosfet as radiation dosimeter", Sensors and Actuators, A 125, pp. 288-295, 2006.). Use of PMOS transistor in dosimeter was first demonstrated by experiments on Explorer-55. MOS dosimeters are used in the spacecraft, radiation therapy and personal dosimetry. (Andrew Holmes-Siedle and Leonard Adams, "The Development of an MOS Dosimeter for use in Space". IEEE Trans. Nucl. Sci., 25(6), pp. 1607-1612, 1978.); L. J. Asensio et. al., "Evaluation of a low-cost commercial MOSFET as radiation dosimeter", Sensors and Actuators, A 125, pp. 288-295, 2006; L. Adams and A. Holmes Siedle, "The development of an MOS dosimetry Unit for use in space", IEEE Trans. Nucl. Sci. NS-25, pp. 1607-1612, 1978; Meinhard Knoll et. al., "MOS dosimeter and method of manufacturing the same". European Patent EP0158588, Kind Code: A2).

Ionizing radiation has its application in the field of medical radiation therapy as a part of cancer treatment to control malignant cells. Radiation therapy is commonly applied to the tumor. For the cure, the malignant cells and cells in the close proximity are exposed to ionizing radiation for different dosage depending on the diagnosis. Highly accurate and online measurement of radiation dosages are primary requirement. Personal dosimetry is an important field where measurement of dose of ionizing radiation is done to know how much of radiation is felt by the person when one is in the ionizing radiation ambient. It is desirable that radiation dosimeters for such application are highly accurate, sensitive, portable, flexible, mechanically robust, able to give online reading, and are cheaper.

Inorganic semiconductor detectors are used in medical therapy and personal dosimetry. They are based on crystalline inorganic semiconducting materials like silicon or germanium which absorb energy from ionizing radiation because of which the covalent bonds in their crystalline structure are broken resulting in free electrons and positive holes in the place of the electrons. Pairs of electron-holes contribute in the generation of a current pulse due to exposure of the detector to ionizing radiation. The current pulse is a measure of the ionizing radiation. (Hiroshi Kitaguchi, Kensuke Amemiya, "Semiconductor radiation detectors and apparatus", European Patent, EP 1584748 A2.). The sensitivity and reliability of the detector varies with temperature because resistivity of any semiconductor decreases with increase in temperature. As the temperature increases due to the thermal energy itself the covalent bonds may break generating electron-hole pairs. As a result, at higher temperatures, the effect of ionizing radiation is not as effectively sensed as at low temperatures. The cost of the detector is also very high because of the inorganic silicon semiconductor technology being costly.

Scintillation counters are also used in medical therapy and personal dosimetry. A scintillation counter comprises a sensor, called a scintillator, which is a transparent crystal, usually phosphor, plastic. (usually containing anthracene), or organic liquid that fluoresces when struck by ionizing radiation. A sensitive photomultiplier tube (PMT) measures the light from the crystal which is a measure of the ionizing radiation. The PMT is attached to an electronic equipment to count and possibly quantify the amplitude of the signals produced by the photomultiplier. (G. F. J. GARLI, "The Physics of Scintillation counter", Journal of Scientific Instruments, vol. 35, 1955; P. F. Hinrichsen, "A stabilized Scintillation counter", IEEE Trans. Nucl. Sci., 1964; J. M. Fontbonne et. al., "Scintillation fiber dosimeter for radiation therapy accelerator", IEEE Trans. Nucl. Sci., Vol. 49, No. 5, 2002; Leonid G Korobchenko, Sergei I. Prokofiev, "Liquid Scintillation Counter", U.S. Pat. No. 4,634,869, 1987; Nurmi et. al., "Liquid Scintillation Counter", U.S. Pat. No. 4,687,935, 1987.). The scintillation counter requires complicated detection circuit to sense radiation on the basis of photons collected. This in turn requires a PMT which has to effectively collect and amplify small amount of fluorescence generated because of ionizing radiation. It also requires a precision low noise amplifier to amplify it to a detectable value. It is also bulky to realize in a badge form for personal dosimetry and expensive.

Thermoluminescent dosimeter (TLD) is the most popular dosimeter for personal dosimetry applications. A TLD measures ionizing radiation exposure by measuring the amount of visible light emitted from a crystal made up of materials like, lithium fluoride (LiF), lithium borate (LiBO$_4$), calcium fluoride (CaF$_3$), or calcium sulphate (CaSO$_4$). As the radiation interacts with the crystal it causes electrons in the crystal's atoms to jump to higher energy states, where they stay trapped due to impurities (usually manganese or magnesium) in the crystal, until heated. On heating the detector crystal the amount of light emitted is measured by a photomultiplier tube to give a current output proportional to the light sensed. The magnitude of the current is proportional to the radiation exposure. (Frank H Attix et. al., "Thermoluminescent Dosimeter", U.S. Pat. No. 3,484,605, 1969.). Immediate or real time read out is not possible with the TLD as it has to be heated to give the radiation dose output. It may cause accidental or unintentional release of trapped electrons in the thermoluminescent material prior to read out by exposure to heat, or light, particularly ultraviolet, thereby creating measurement errors. Humidity can also affect the working of the TLD and degrade efficiency thereof.

Organic semiconducting materials are generally used for making organic electronic devices like organic light emitting diodes (OLEDs), organic photo voltaic cells (OPVs) and organic field effect transistors (OFETs). These electronic devices are presently receiving significant attention in organic electronics because of their potential applications in digital switches, backplanes for flat panel displays or radio frequency identification tags (J M Shaw, P F Seidler, "Organic Electronics: Introduction", IBM J. RES. & DEV. Vol. 45 No. 1, pp. 3-9, 2001; C D Dimitrakopoulos, D J Mascaro, "Organic thin film transistors: A review of recent advances", IBM J. RES. & DEV. Vol. No. 1, pp. 11-29, 2001; T. W. Kelley, L. D. Boardman, T. D. Dunbar, D. V. Muyres, M. J. Pellerite, and T. P. Smith, "High-Performance OTFTs Using Surface-Modified Alumina Dielectrics," J. Phys. Chem. B., vol. 107, pp. 5877-5881, 2003; Christos D. Dimitrakopoulos and Patrick R. L. Malenfant, "Organic Thin Film Transistors for Large Area Electronics", Advanced Materials, Volume 14, Issue 2, pp. 99-117, 2002; H. Klauk, M. Halik, U. Zschieschang, F. Eder, D. Rohde, G. Schmid, and C. Dehm, "Flexible Organic Complementary Circuits," IEEE Trans. on Elect. Dev., vol. 52, pp. 618-622, 2005). Use of organic semiconductor material is also explored for vapor sensing applications and chemical sensing applications. (D A Thomas et. al., "Organic Semiconductor Sensor Devices", U.S. Pat. No. 7,141,839, B2, 2006; Heny Wohltjen et. al., "Organic Semiconductor Vapor Sensing Method", U.S. Pat. No. 4,572,900, 1986.).

OBJECTS OF THE INVENTION

An object of the invention is to provide use of an organic semiconducting material sensor for determining ionizing radiation proportional to the change in resistivity or conductivity of the sensor.

Another object of the invention is to provide a method for determining ionizing radiation which method is simple and easy to carry out, versatile and is cost effective.

Another object of the invention is to provide an electronic device for determining ionizing radiation which device is simple in construction and operation and is cost effective.

Another object of the invention is to provide an electronic device for determining ionizing radiation which device is very sensitive.

Another object of the invention is to provide an electronic device for determining ionizing radiation which device has additional advantages like large area coverage and structural flexibility.

Another object of the invention is to provide an electronic device for determining ionizing radiation which device can be a passive device or an active device and can measure the ionizing radiation on a real time basis.

Another object of the invention is to provide an electronic device for determining ionizing radiation which device is versatile.

Another object of the invention is to provide an electronic device for determining ionizing radiation which device is compact and portable.

DETAILED DESCRIPTION OF THE INVENTION

According to the invention there is provided use of an organic semiconducting material sensor for determining ionizing radiation proportional to the change in resistivity or conductivity of the sensor.

According to the invention there is also provided a method for determining ionizing radiation comprising the steps of:
  (i) applying a constant voltage across an organic semiconducting material sensor prior to and after exposure of the sensor to the ionizing radiation;
  (ii) measuring and converting the current passing through the sensor proportional to the conductivity or resistivity of the sensor which in turn is proportional to the ionizing radiation in the sensor, into a proportional analog voltage value; and if desired converting the analog voltage value into digital value; and
  (iii) comparing the analog/digital values obtained prior to and after exposure of the sensor to the ionizing radiation and computing the ionizing radiation based on the change in the analog/digital values.

According to the invention there is also provided a method for determining ionizing radiation comprising the steps of:
  (i) applying a constant voltage across the electrodes of an organic semiconductor resistor prior to and after exposure of the resistor to the ionizing radiation;
  (ii) measuring and converting the current passing through the organic semiconductor resistor proportional to the conductivity or resistivity of the organic semiconductor resistor which in turn is proportional to the ionizing radiation in the organic semiconductor resistor, into a proportional analog voltage value; and if desired converting the analog voltage value into digital value; and
  (iii) comparing the analog/digital values obtained prior to and after exposure of the resistor to the ionizing radiation and computing the ionizing radiation based on the change in the analog/digital values.

According to the invention there is also provided a method for determining ionizing radiation comprising the steps of: applying a constant voltage across the drain and source terminals of an organic field effect transistor (OFET) and applying terminal voltage at the gate terminal of the OFET prior to and after exposure of the OFET to the ionizing radiation;
  (ii) measuring and converting the drain current (ON current) of the OFET proportional to the conductivity or resistivity of the OFET into proportional analog voltage value; and if desired converting the analog voltage value into digital value; and
  (iii) comparing the analog/digital values obtained prior to and after exposure of the OFET to the ionizing radiation and computing the ionizing radiation based on the change in the analog/digital values.

According to the invention there is also provided a method for determining ionizing radiation comprising the steps of
  (i) applying a constant voltage across the drain and source terminals of an organic field effect transistor (OFET) and applying zero voltage at the gate terminal of the OFET prior to and after exposure of the OFET to the ionizing radiation;
  (ii) measuring and converting the drain current (OFF Current) of the OFET proportional to the conductivity or resistivity of the OFET into proportional analog voltage value; and if desired converting the analog voltage value into digital value; and
  (iii) comparing the analog/digital values obtained prior to and after exposure of the OFET to the ionizing radiation and computing the ionizing radiation based on the change in the analog/digital values.

According to the invention there is also provided a method for determining ionizing radiation comprising the steps of:
  (i) applying a constant voltage across the drain and source terminals of an organic field effect transistor (OFET) and applying zero voltage to terminal voltage at the gate terminal of the OFET prior to and after exposure of the OFET to the ionizing radiation;
  (ii) measuring and converting the drain current of the OFET at different gate voltages proportional to the conductivity or resistivity of the OFET into proportional analog voltage values and if desired converting the analog voltage values into digital values; and
  (iii) computing the ratio between the analog/digital values corresponding to ON current (current at terminal gate voltage) and OFF current (current at zero gate voltage) of the OFET prior to and after exposure of the OFET to the ionizing radiation, comparing the current ratios and computing the ionizing radiation based on the changes in the current ratios.

According to the invention there is also provided a method for determining ionizing radiation comprising the steps of:

(i) applying a constant voltage across the drain and source terminals of an organic field effect transistor (OFET) and applying zero voltage to terminal voltage at the gate terminal of the OFET prior to and after exposure of the OFET to the ionizing radiation;

(ii) measuring and converting the drain current of the OFET at different gate voltages proportional to the conductivity or resistivity of the OFET into proportional analog voltage values and if desired converting the analog voltage values to digital values; and (iii) computing the threshold voltages of the OFET prior to and after exposure of the OFET to the ionizing radiation based on the analog/digital values, comparing the threshold voltages of the OFET and computing the ionizing radiation based on the change in the threshold voltages.

According to the invention there is also provided a method for determining ionizing radiation comprising the steps of:

(i) applying a constant voltage across the drain and source terminals of an organic field effect transistor (OFET) and applying zero voltage to terminal voltage at the gate terminal of the OFET prior to and after exposure of the OFET to the ionizing radiation;

(ii) measuring and converting the drain current of the OFET at different gate voltages proportional to the conductivity or resistivity of the OFET into proportional analog voltage values and if desired converting the analog voltage values into digital values; and (iii) computing the sub-threshold swing value or sub-threshold slope value of the OFET with the drain current values and gate voltage values prior to and after exposure of the OFET to the ionizing radiation, comparing the sub-threshold swing values or sub-threshold slope values and computing the ionizing radiation based on the change in the sub-threshold swing values or sub-threshold slope values.

According to the invention there is also provided a method for determining ionizing radiation comprising the steps of:

(i) applying a constant voltage across the drain and source terminals of an organic field effect transistor (OFET) and applying zero voltage to terminal voltage at the gate terminal of the OFET prior to and after exposure of the OFET to the ionizing radiation;

(ii) measuring and converting the drain current of the OFET at different gate voltages proportional to the conductivity or resistivity of the OFET into proportional analog voltage values and if desired converting the analog voltage values into digital values; and (iii) computing the sub-threshold swing values of the OFET with the drain current values and gate voltage values prior to and after exposure of the OFET to the ionizing radiation, comparing the sub-threshold swing values and computing the change in the sub-threshold swing values, computing the change in the number of interface states ($\Delta$ Nit) at the interface of gate dielectric and the OFET using the change in the sub-threshold swing values; and computing the ionizing radiation based on the change in the number of interface states.

The method as described above further comprises displaying the ionizing radiation value or outputting the ionizing radiation value for further processing.

According to the invention there is also provided an electronic device for determining ionizing radiation, the device comprising an organic semiconducting material sensor for sensing the ionizing radiation proportional to the change in resistivity or conductivity of the sensor.

Preferably the organic semiconducting material sensor is an organic semiconductor resistor or organic field effect transistor (OFET).

According to the invention there is also provided an electronic device for determining ionizing radiation, the device comprising an organic semiconductor resistor connected to a constant voltage source and to a current to voltage converter, an analog to digital converter connected to the current to voltage converter and a microprocessor connected to the analog to digital converter.

According to the invention there is also provided an electronic device for determining ionizing radiation, the device comprising an organic semiconductor resistor connected to a constant voltage source and to a current to voltage converter and an analog circuit connected to the current to voltage converter.

According to the invention there is also provided an electronic device for determining ionizing radiation, the device comprising an organic field effect transistor (OFET), the gate terminal, source terminal and drain terminal of which are connected to a variable voltage source, constant voltage source and current to voltage converter, respectively and an analog to digital converter connected to the current to voltage converter and a microprocessor connected to the analog to digital converter and the variable voltage source.

According to the invention there is also provided an electronic device for determining ionizing radiation, the device comprising an organic field effect transistor (OFET), the gate terminal, source terminal and drain terminal of which are connected to a variable voltage source, constant voltage source and current to voltage converter, respectively and an analog circuit connected to the current to voltage converter and the variable voltage source.

The electronic device as described above includes a display connected to the microprocessor or analog circuit.

The following is a detailed description of the invention with reference to the accompanying drawings, in which.

Figure 1:
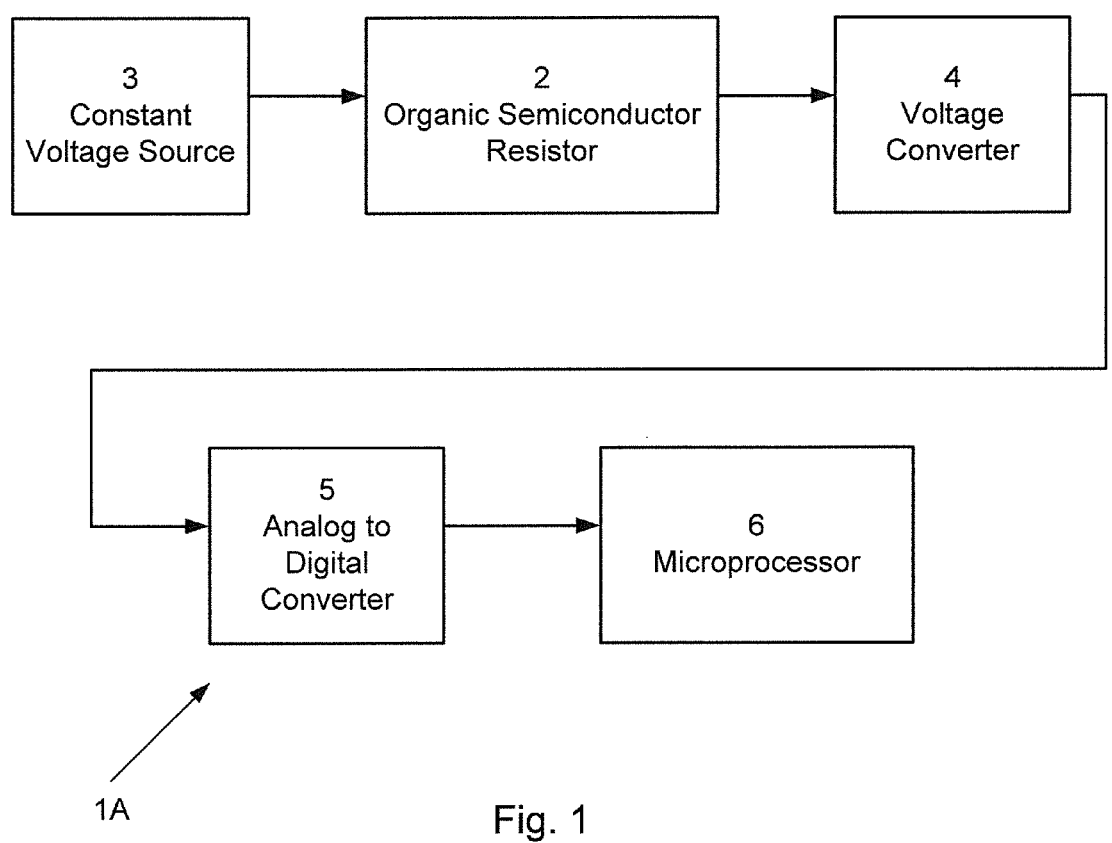
FIG. 1 is a block diagram of the electronic device for determining ionizing radiation according to an embodiment of the invention.
Figure 2:
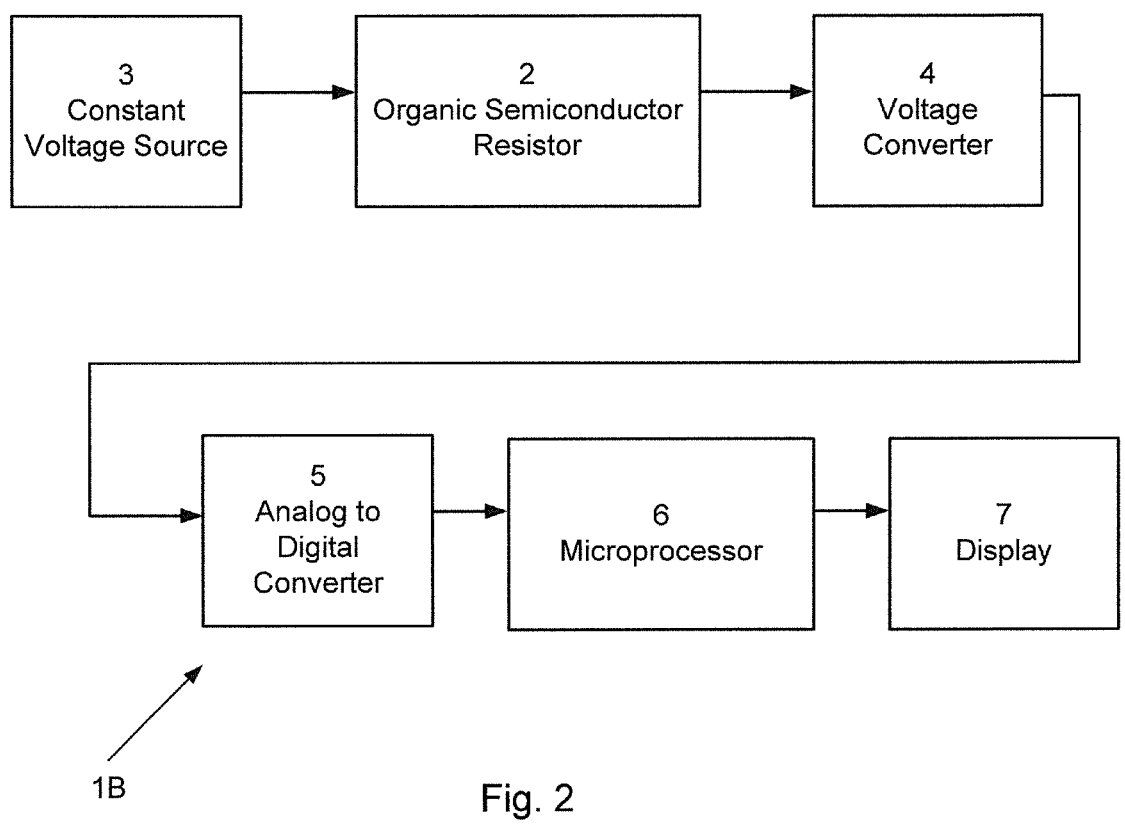
FIG. 2 is a block diagram of the electronic device for determining ionizing radiation according to another embodiment of the invention.

The electronic device 1A as illustrated in FIG. 1 of the accompanying drawings comprises an organic semiconductor resistor 2 connected to a constant voltage source 3 and to a current to voltage converter 4. 5 is an analog to digital converter connected to the current to voltage converter. 6 is a microprocessor connected to the analog to digital converter. A constant voltage is applied across the sensor prior to and after exposure of the sensor to an ionizing radiation by switching on the constant voltage source 3. The current passing through the sensor is proportional to the conductivity or resistivity of the sensor which in turn is proportional to the ionizing radiation in the sensor. This current is measured and converted into a proportional analog voltage value by the current to voltage converter 4. The analog voltage value is converted into a digital value by converter 5. The microprocessor compares the digital value obtained prior to and after exposure of the sensor to the ionizing radiation and computes the ionizing radiation based on the change in the digital value. This signal is outputted for further processing or displayed. The device 1B as illustrated in FIG. 2 of the accompanying drawings includes a display 7 for such purpose. The analog to digital converter and microprocessor are optional, in which case the current to voltage converter is connected to an analog circuit which computes ionizing radiation experienced by the sensor using analog values.

Figure 3:
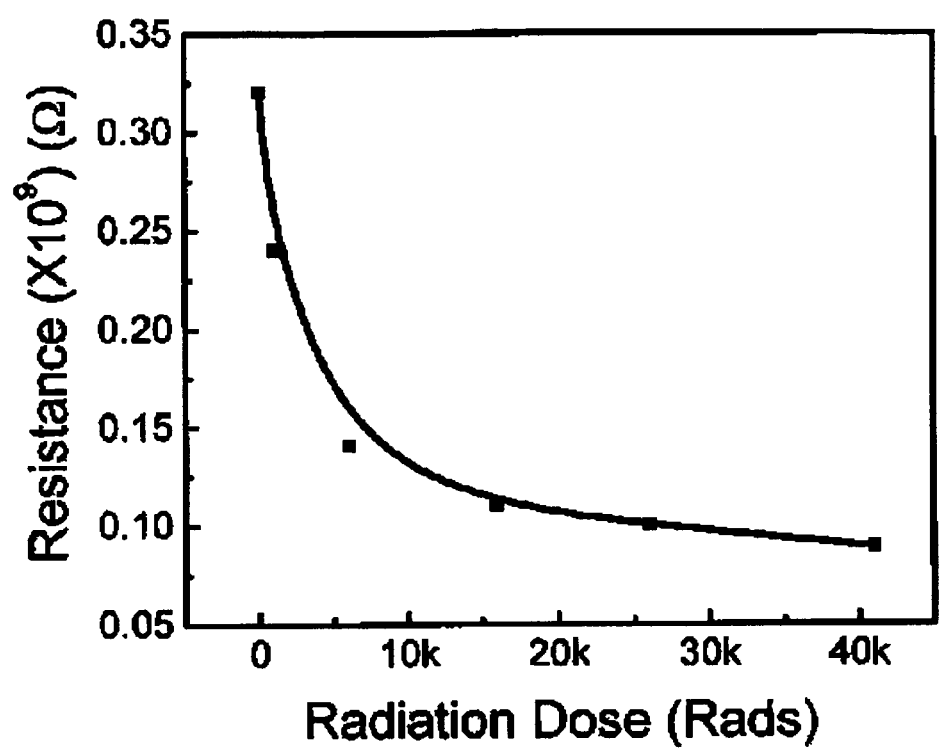
FIG. 3 is a graphical representation of experimental data obtained with a typical device of FIG. 1.

Ionizing radiation was determined using a typical device of FIG. 1 comprising an organic semiconductor resistor formed by an interdigitated cell coated with poly-3-hexylthiophene (P3HT) procured from Sigma-Adlrich. The constant voltage applied was 40 V DC and the ionizing radiation applied was $^{60}Co$. The measurement details were as shown in FIG. 3 of the accompanying drawings. It is seen in FIG. 3 that the resistance of the semiconductor resistor increases with the increase in the radiation dose. Therefore, the device can be advantageously used for determining ionizing radiation.

Figure 4:
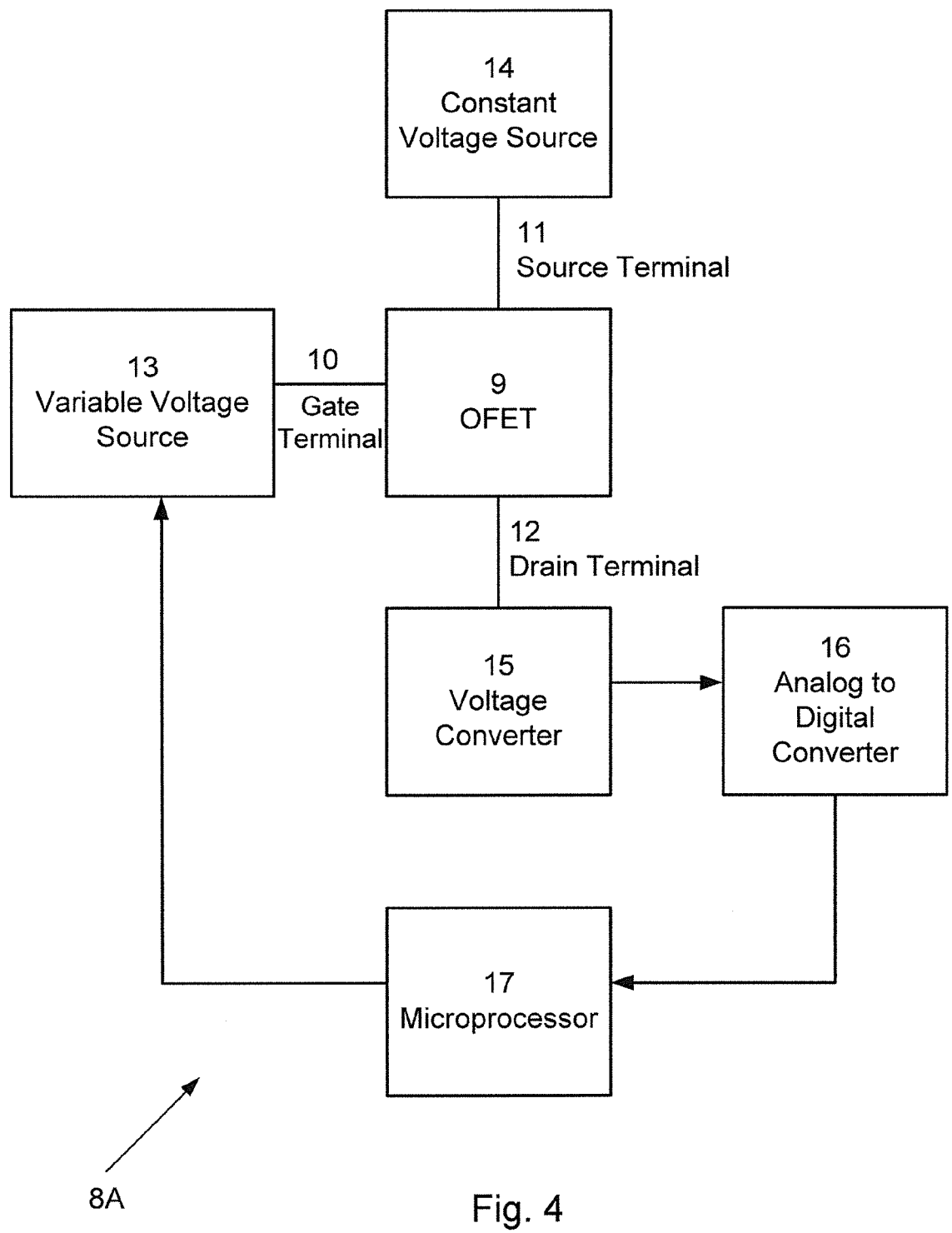
FIG. 4 is a block diagram of the electronic device for determining ionizing radiation according to another embodiment of the invention.
Figure 5:
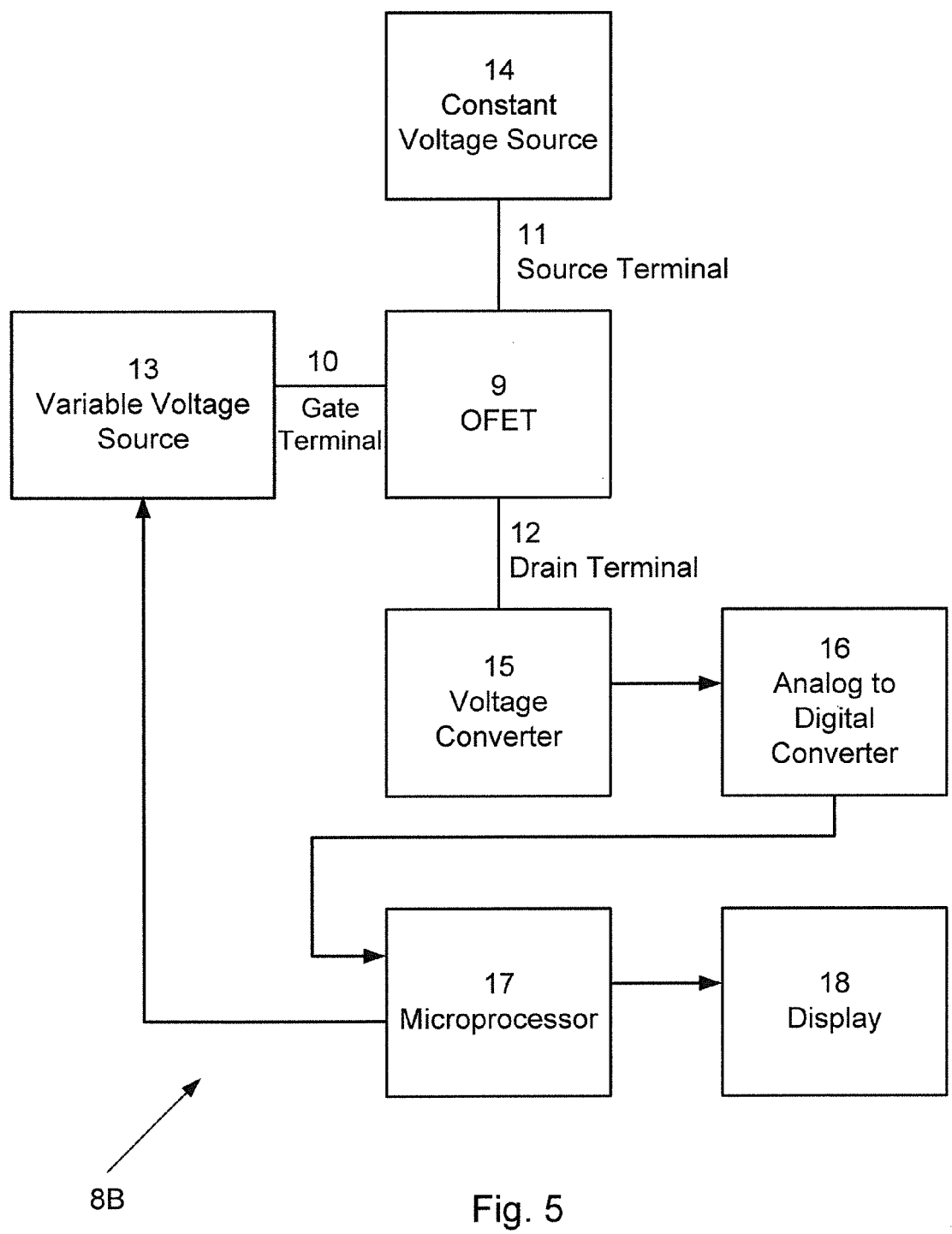
FIG. 5 is a block diagram of the electronic device for determining ionizing radiation according to another embodiment of the invention.

The device 8A as illustrated in FIG. 4 of the accompanying drawings comprises an OFET 9, the gate terminal 10, source terminal 11 and drain terminal 12 of which are connected to a variable voltage source 13, constant voltage source 14 and current to voltage converter 15 respectively. 16 is an analog to digital converter connected to the current to voltage converter and 17 is a microprocessor connected to the analog to digital converter and variable voltage source. Using the device of FIG. 4 measurement of ionizing radiation is carried out as follows:

A constant voltage is applied across the drain and source terminal of the OFET and terminal voltage is applied at the gate terminal of the OFET prior to and after exposure of the OFET to the ionizing radiation. The drain current (ON current) of the OFET proportional to the conductivity or resistivity of the OFET is measured and converted into a proportional analog voltage value by the current to voltage converter. The analog voltage value is converted into a digital value by converter 16. The microprocessor compares the digital values obtained prior to and after exposure of the OFET to the ionizing radiation and computes the ionizing radiation based on the change in the analog digital values. Alternatively a constant voltage is applied across the drain and source terminals of the OFET and zero voltage is applied at the gate terminal of the OFET prior to and after exposure of the OFET to the ionizing radiation. The drain current (OFF current) of the OFET proportional to the conductivity or resistivity of the OFET is measured and converted into proportional analog voltage value by the current to voltage converter. The analog to digital converter converts this value into a digital value. The microprocessor compares the digital values obtained prior to and after exposure of the OFET to the ionizing radiation and computes the ionizing radiation based on the change in the digital values. Alternatively a constant voltage is applied across the drain and source terminals of the OFET and zero voltage to terminal voltage is applied at the gate terminal of the OFET prior to and after exposure of the OFET to the ionizing radiation. The drain current of the OFET at different gate voltages proportional to the conductivity or resistivity of the OFET is measured and converted into the proportional analog voltage value by current to voltage converter 15. Analog to digital converter 16 converts the analog value into a digital value. Microprocessor 17 computes the ratio between the digital values corresponding to ON current (current at terminal gate voltage) and OFF current (current at zero gate voltage) of the OFET prior to and after exposure of the OFET to the ionizing radiation. The current ratios are compared and the ionizing radiation is computed based on the changes in the current ratios. Alternatively a constant voltage is applied across the drain and source terminals of the OFET and zero voltage to terminal voltage is applied at the gate terminal of the OFET prior to and after exposure of the OFET to the ionizing radiation. The drain current of the OFET at different gate voltages proportional to the conductivity or resistivity of the OFET is measured and converted into proportional analog voltage value by the current to voltage converter 15. Analog to digital converter 16 converts the analog voltage value to digital values. Microprocessor 17 computes the threshold voltages of the OFET prior to and after exposure of the OFET to the ionizing radiation based on the analog/digital values, compares the threshold voltages of the OFET and computes the ionizing radiation based on the change in the threshold voltages. Alternatively a constant voltage is applied across the drain and source terminals of the OFET and zero voltage to terminal voltage is applied at the gate terminal of the OFET prior to and after exposure of the OFET to the ionizing radiation. The drain current of the OFET at different gate voltages proportional to the conductivity or resistivity of the OFET is measured and converted into proportional analog voltage values by the current to voltage converter 15. Analog to digital converter 16 converts the analog voltage values into digital values. Microprocessor 17 computes the sub-threshold swing value (or sub-threshold slope value) of the OFET with the drain current values and gate voltage values prior to and after exposure of the OFET to the ionizing radiation, compares the sub-threshold swing values (or sub-threshold slope values) and computes the ionizing radiation based on the change in the sub-threshold swing values (or sub-threshold slope values). Alternatively a constant voltage is applied across the drain and source terminals of the OFET and zero voltage to terminal voltage is applied at the gate terminal of the OFET prior to and after exposure of the OFET to the ionizing radiation. The drain current of the OFET at different gate voltages proportional to the conductivity or resistivity of the OFET is measured and converted into proportional analog voltage values by current to voltage converter 15. Analog to digital converter 16 converts the analog values into digital values. Microprocessor 17 computes the sub-threshold swing values of the OFET with the drain current values and gate current values prior to and after exposure of the OFET to the ionizing radiation. The sub-threshold swing values are compared and the change in the sub-threshold swing values is computed. The change in the number of interface states ($\Delta N_{it}$) at the interface of gate dielectric and the OFET is computed using the change in the sub-threshold swing values. The ionizing radiation is computed based on the change in the number of interface states. The analog to digital converter and microprocessor are optional in which case the analog values from current to voltage converter 15 are directly processed by an analog circuit. The device 8B as illustrated in FIG. 5 of the accompanying drawings comprises a display 18 for displaying the measured ionizing radiation values.

Figure 6:
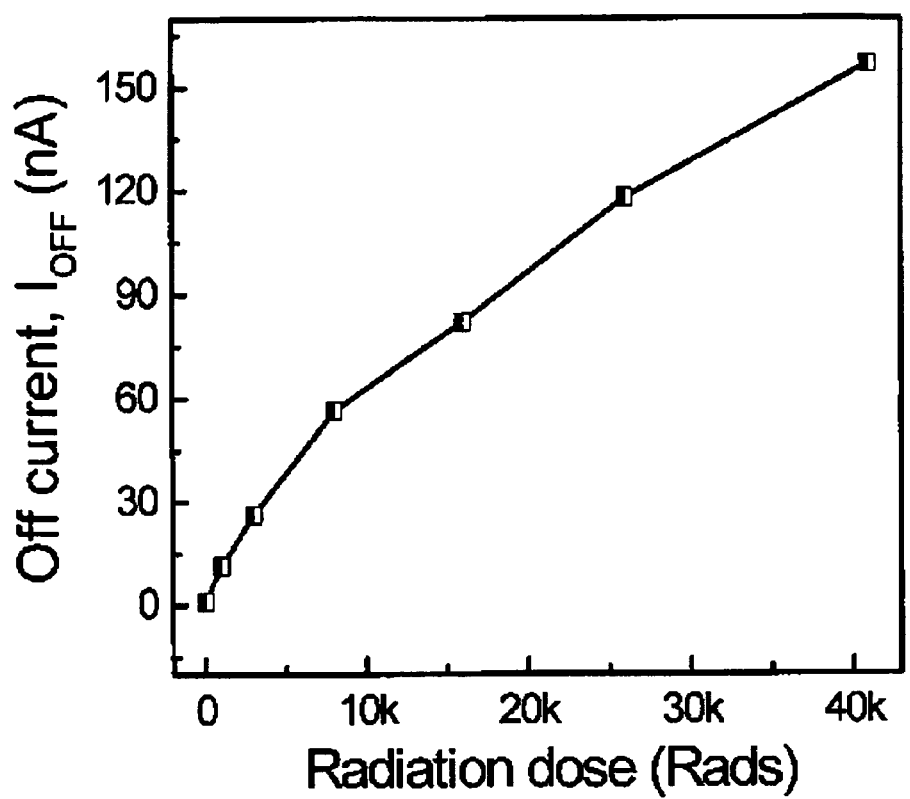
FIGS. 6 to 11 are graphical representations of the experimental data as obtained by a typical device of FIG. 4.
Figure 7:
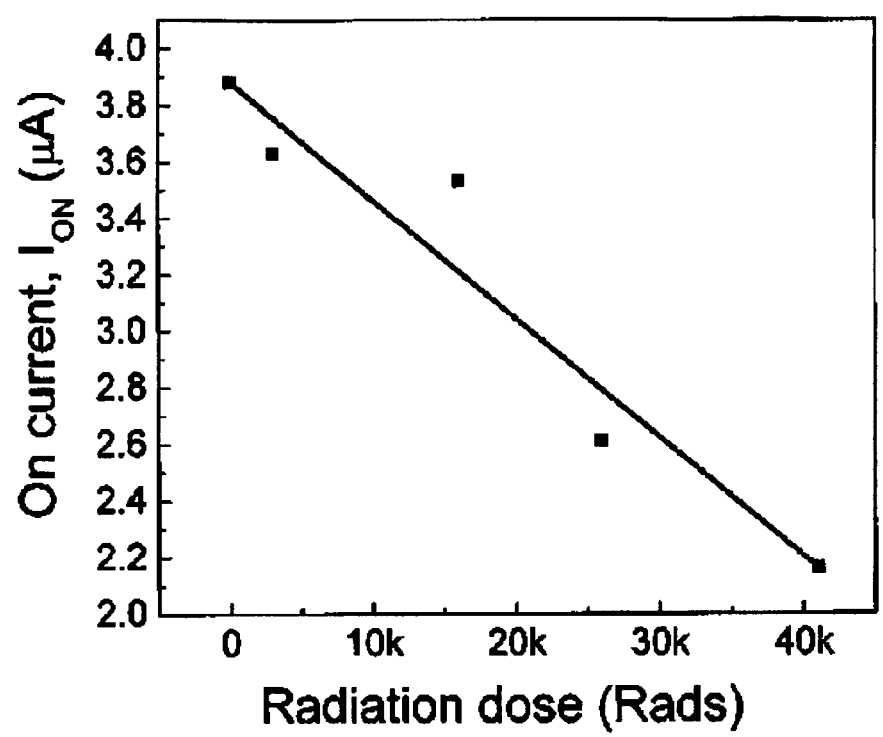
Figure 8:
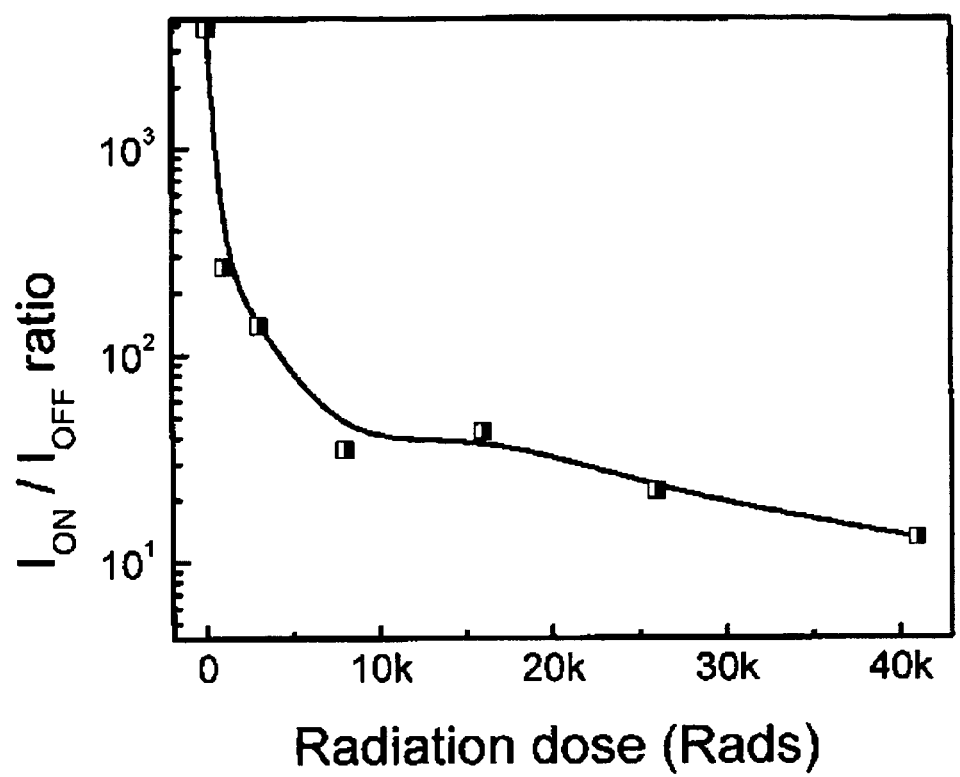
Figure 9:
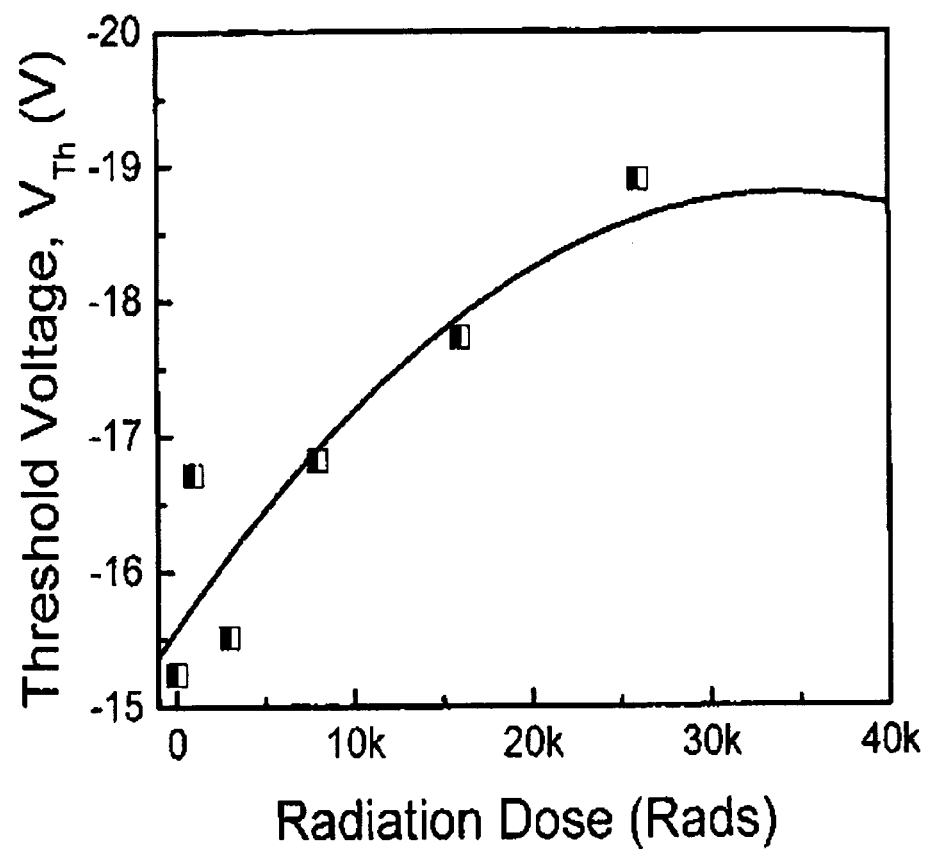
Figure 10:
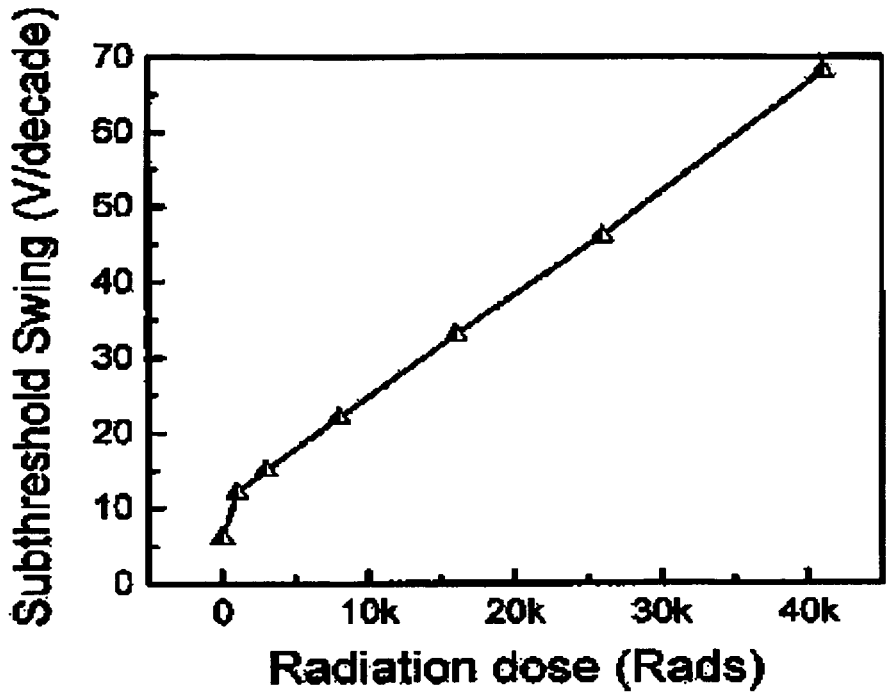
Figure 11:
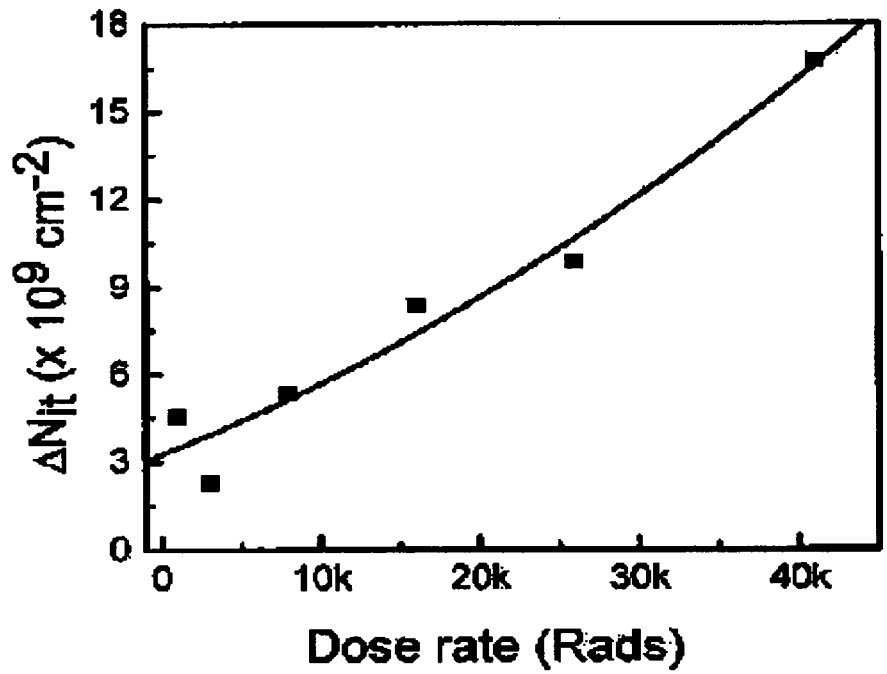

Ionizing radiation was determined using a typical device of FIG. 4 comprising an OFET coated with poly-3-hexylthiophene (P3HT) procured from Sigma-Adlrich. The ionizing radiation applied was $^{60}Co$, constant voltage applied was −40 V DC and the variable voltage varied from 0 V to −40 V DC. FIG. 6 of the accompanying drawings shows change in OFF current with subsequent radiation dose. It is seen in FIG. 6 that OFF current increases with the radiation dose. FIG. 7 of the accompanying drawings shows the relationship between radiation dose and ON current. It is seen in FIG. 7 that ON current decreases with radiation dose. FIG. 8 of the accompanying drawings shows the relationship between radiation dose and the ratio between ON current and OFF current. It is seen in FIG. 8 that the ratio decreases with the increase in radiation dose. FIG. 9 of the accompanying drawings shows the relationship between threshold voltage and radiation dose. It is seen in FIG. 9 that the threshold voltage changes with subsequent increase in radiation dose. FIG. 10 of the accompanying drawings shows the relationship between the sub-threshold swing and radiation dose. It is seen in FIG. 10 that the sub-threshold swing value increases with the subsequent increase in radiation dose. FIG. 11 of the accompanying drawings shows the relationship between the number of interface states and radiation dose. It is seen in FIG. 11 that the number of interface states increases with the subsequent increase in radiation dose.

According to the invention various electrical parameters or characteristics like resistivity, conductivity, ON current, OFF current mobility, ON current and OFF current ratio, shift in threshold voltage, change in interface trap density or degradation in sub-threshold slope/swing can be advantageously used to measure ionizing radiation. Organic semiconducting material sensor has various advantages like large area coverage, structural flexibility, simplicity in processing and low processing cost. Besides having all these advantages the device of the invention is also simple in construction, easy and convenient to operate and is cost effective. Because of the relationship between the ionizing radiation and the electrical parameters or characteristics as explained above, the device of the invention is very sensitive especially those of FIGS. 4 and 5 used for determining ionizing radiation using electrical parameters like shift in threshold voltage, change in interface trap density and degradation in sub-threshold slope/swing value. The device of the invention can be used both as a passive dosimeter or as an active dosimeter. As a passive dosimeter it does not require any power supply at the time of sensing the ionizing radiation by the sensor. Only when the ionizing radiation is to be determined the sensor is connected to the constant voltage source and current to voltage converter or to the variable voltage source, constant voltage source and current to voltage converter as the case may be. The device of the invention also can be used as an active device in which case the sensor is kept exposed to the ionizing radiation environment and ionizing radiation is continuously monitored on a real time basis. The method of the invention is also simple and easy to carry out and cost effective. Both the device and method are also versatile in terms of making use of different electrical characteristics or parameters. The device of the invention is also compact and portable and as passive dosimeter the organic semiconducting material sensor also can be used as a badge.

The invention claimed is:

1. A method for determining ionizing radiation comprising the steps of:
    applying a constant voltage across the drain and source terminals of an organic field effect transistor (OFET) and applying terminal voltage at the gate terminal of the OFET prior to and after exposure of the OFET to the ionizing radiation;
    measuring and converting the drain current (ON current) of the OFET proportional to the conductivity or resistivity of the OFET, prior to and after exposure of the OFET to the ionizing radiation, into proportional analog voltage values; and
    comparing the analog values obtained prior to and after exposure of the OFET to the ionizing radiation and computing the ionizing radiation based on a change in the analog values.

2. The method as claimed in claim 1, further comprising displaying a value of the ionizing radiation or outputting the value of the ionizing radiation for further processing.

3. The method as claimed in claim 2, further comprising displaying a value of the ionizing radiation or outputting the value of the ionizing radiation for further processing.

4. A method for determining ionizing radiation comprising the steps of:
    applying a constant voltage across the drain and source terminals of an organic field effect transistor (OFET) and applying terminal voltage at the gate terminal of the OFET prior to and after exposure of the OFET to the ionizing radiation;
    measuring and converting a drain current (ON current) of the OFET proportional to the conductivity or resistivity of the OFET, prior to and after exposure of the OFET to the ionizing radiation, into proportional analog voltage values;
    converting the analog voltage values into digital values; and
    comparing the digital values obtained prior to and after exposure of the OFET to the ionizing radiation and computing the ionizing radiation based on a change in the digital values.

* * * * *